United States Patent [19]

Boscovic et al.

[11] Patent Number: 5,748,038

[45] Date of Patent: May 5, 1998

[54] METHOD FOR AMPLIFIER TRAINING IN A LINEAR POWER AMPLIFIER

[75] Inventors: Dragan Boscovic; Stephen Valentine, both of Basingstoke, United Kingdom; Babak Bastani, Plantation, Fla.; Anthony Wray, Basingstoke, United Kingdom

[73] Assignee: Motorola, Inc., Schaumburg, Ill.

[21] Appl. No.: 873,872

[22] PCT Filed: Mar. 2, 1995

[86] PCT No.: PCT/EP95/00753

§ 371 Date: Dec. 26, 1995

§ 102(e) Date: Dec. 26, 1995

[87] PCT Pub. No.: WO95/24765

PCT Pub. Date: Sep. 14, 1995

Related U.S. Application Data

[63] Continuation of Ser. No. 545,660, Dec. 26, 1995, abandoned.

[30] Foreign Application Priority Data

Mar. 9, 1994 [GB] United Kingdom ............... 9404560

[51] Int. Cl.[6] .................................................. H03G 3/30
[52] U.S. Cl. ........................................ 330/2; 330/129
[58] Field of Search .................... 330/2, 85, 129, 330/284; 455/126

[56] References Cited

U.S. PATENT DOCUMENTS

| | | | |
|---|---|---|---|
| 4,992,753 | 2/1991 | Jenson et al. | 330/129 |
| 5,041,793 | 8/1991 | Gailus | 330/2 |
| 5,376,895 | 12/1994 | Aihara | 330/129 |
| 5,467,055 | 11/1995 | Wray et al. | 330/129 |
| 5,469,105 | 11/1995 | Sparks | 330/129 |
| 5,524,285 | 6/1996 | Wray et al. | 455/126 |

*Primary Examiner*—Steven Mottola
*Attorney, Agent, or Firm*—Wayne J. Egan

[57] ABSTRACT

A method for amplitude training for a power amplifier is described employing adaptively changing an input training signal of a feedback circuit.

13 Claims, 3 Drawing Sheets

METHOD FOR AMPLIFIER TRAINING IN A LINEAR POWER AMPLIFIER

This is a continuation of prior application Ser. No. 08/545,660 filed Dec. 26, 1995, and now abandoned, by Dragon Boscovic et al., the same inventors as in the present application, which prior application is assigned to Motorola, Inc., the same assignee as in the present application, and which prior application is hereby incorporated by reference verbatim, with the same effect as though the prior application were fully and completely set forth herein.

FIELD OF THE INVENTION

This invention relates to a power amplifier, such as an amplifier employing closed loop feedback (e.g. Cartesian feedback) and it specifically relates to linearisation of such power amplifier.

BACKGROUND TO THE INVENTION

Linear transmitters are well known. To achieve both linearity and efficiency in such devices linearisation techniques are employed in a power amplifier such as a Cartesian feedback loop. A Cartesian feedback loop is a closed loop negative feedback technique which sums the baseband feedback signal in it's I and Q formats to I and Q input signals prior to amplifying and up-converting the signal to its output frequency and power level.

New digital linear technologies require highly linear amplification which cannot be achieved through conventional transmitter design. Meanwhile, limited spectrum resources are continually forcing the development of spectrally efficient linear power transmitters. The restrictions on out-of-band emissions are severe (−60 dBc to −70 dBc). Furthermore, operating efficiency of the amplifiers must also be maximised.

U.S. Pat. No. 5,066,923 to Motorola, Inc. describes a training scheme of linear power amplifiers in which a high degree of linearity is achieved and maintained through amplifier trig efforts performed over short periods of time. The training must be accomplished before the transmitter operates in normal transmitting mode. The training effort comprises of phase and amplitude training periods. Phase training is used in order to secure the stability in the closed loop amplifier operation while amplitude training is responsible for a level set-up of input signal hence preventing amplifier non-linearity due to excessive levels of the driving signal.

One method of amplitude training includes increasing the voltage of an input test signal over a period of time reaching levels high enough to drive the power amplifier into saturation. Differential voltage at the output of a summation point is used as a measure of amplifier linearity. The level of the input signal that makes the differential voltage go above a predefined threshold is detected and known as the clipping point. During transmission the amplitude range of a message signal is maintained below clipping point thus ensuring amplifier operation in linear range. Thus, when properly adjusted such power amplifiers operate in a satisfactorily linear mode.

A disadvantage of the above described training method is that during training the ramping up of the input training signal does not stop after clipping point is reached, in fact, the ramp up continues past clipping point causing the power amplifier to splatter. In other words, the training input signal ramps up for a period of time in which the threshold voltage is exceeded causing undesired adjacent channel interference.

It is desired to have method of amplitude training for a power amplifier where the input training signal does not exceed clipping point thereby minimising the amount of adjacent channel interference.

SUMMARY OF THE INVENTION

A method is provided for determining an optimum operating point in a linear power amplifier by adaptively changing an input training signal of a feedback circuit.

A first embodiment of the present invention includes adaptively changing the input training signal by iteratively changing a parameter of a feedback circuit thereby performing multiple iterations of the feedback circuit during a training period.

The parameters that may be iteratively changed are the time duration of each iteration (sequence) and the magnitude of the input training signal.

DETAILED DESCRIPTION OF THE PREFERRED EMBODIMENTS

A training method for a linear power amplifier is described in U.S. Pat. No. 5,066,923 which is hereby incorporated by reference.

Figure 1:
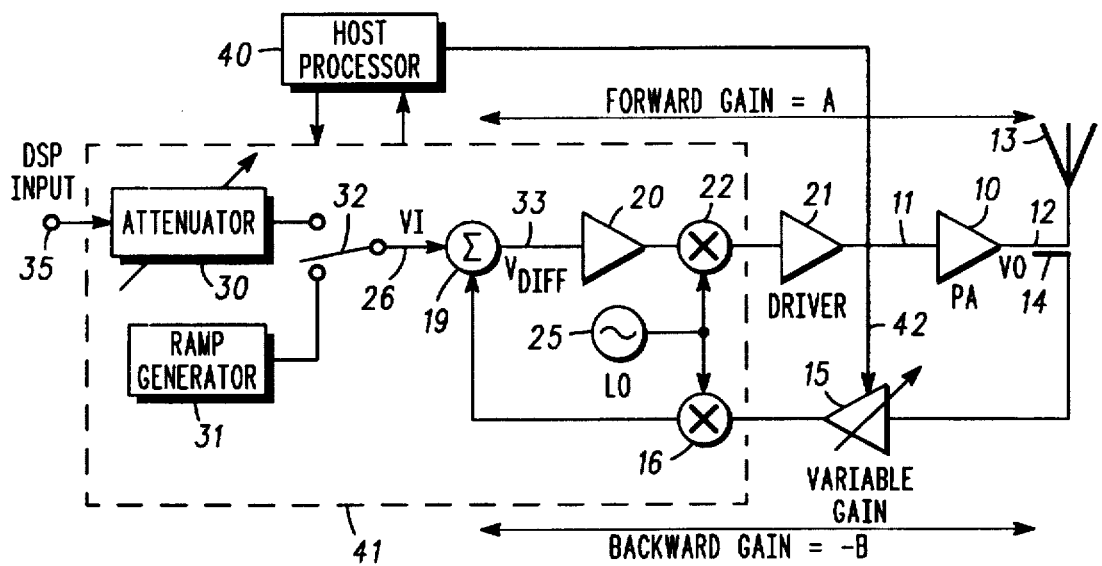
FIG. 1 is a block diagram of a linear transmitter according to a first embodiment of the present invention.

FIG. 1 of the present invention shows a linear transmitter or power amplifier for employing Cartesian feedback linearisation in accordance with a first embodiment of the present invention. The linear transmitter comprises a power amplifier device 10 having an input 11 and an output 12. The output 12 is coupled to an antenna 13 and a feedback coupler 14. The feedback coupler 14 is connected to a variable gain element or attenuator 15. The variable gain element is connected to a mixer 16. The mixer 16 is connected to a negative input of a summing element 19. The summing element 19 outputs a differential voltage ($V_{dif}$)$_{33}$ which is inputted to a gain element 20. The gain element 20 is connected to a converter mixer 22.

An output of the converter mixer 22 is connected via a driver 21 to the input 11 of the power amplifier device 10. A local oscillator 25 supplies an injection signal to the mixers 22 and 16.

Connected to the positive input 26 of the summing element 19 are gain elements 30 and 31, having a respective switch 32. The gain elements 30 and 31 may be implemented as an attenuator and a ramp generator, respectively. The gain element 30 receives a signal input from a digital signal processor ("DSP") 35.

Elements 20, 21, 22 and 10 have a combined gain (forward gain) equal to A. Elements 16 and 16 have a combined gain (backward gain) equal to −B. A controller or host processor 40 controls the gain element 15 and desired integrated elements on a single IC 41.

Figure 2:
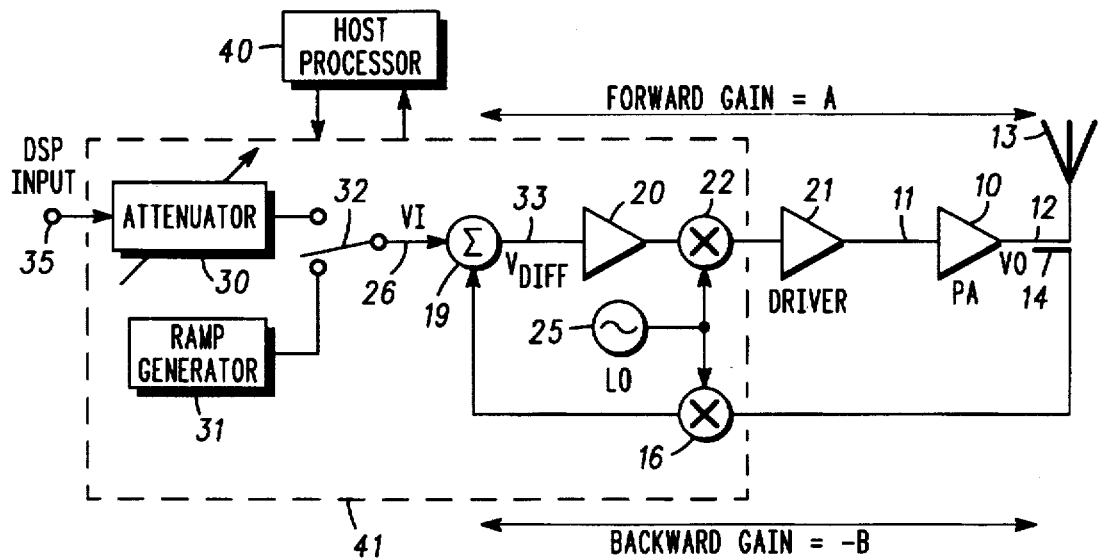
FIG. 2 is a block diagram of a linear transmitter according to a second embodiment of the present invention.

FIG. 2 is an alternate embodiment of the block diagram of FIG. 1 as described below.

When the amplifier 10 operates in amplitude training mode to determine an optimum operating point (clip point) of the power amplifier the differential voltage ($V_{diff}$)33 outputted by the summing element 19 is used to measure the amplifier linearity. Thus, the differential voltage 33 is also known as error voltage.

The differential error voltage is given by:

$$V_{diff}=V_{in}/(1+AB)$$

where $V_{diff}$=differential voltage 33, $V_{in}$=input voltage 26, and

AB=loop gain.

By comparing the differential voltage 33 against a threshold voltage a clip point may be detected.

Figure 3:
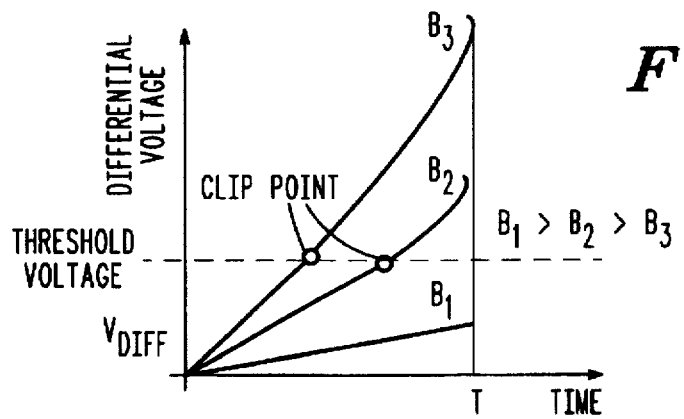
FIG. 3 is a differential voltage graph resulting from employing the embodiments of FIGS. 1 or 2.
Figure 4:
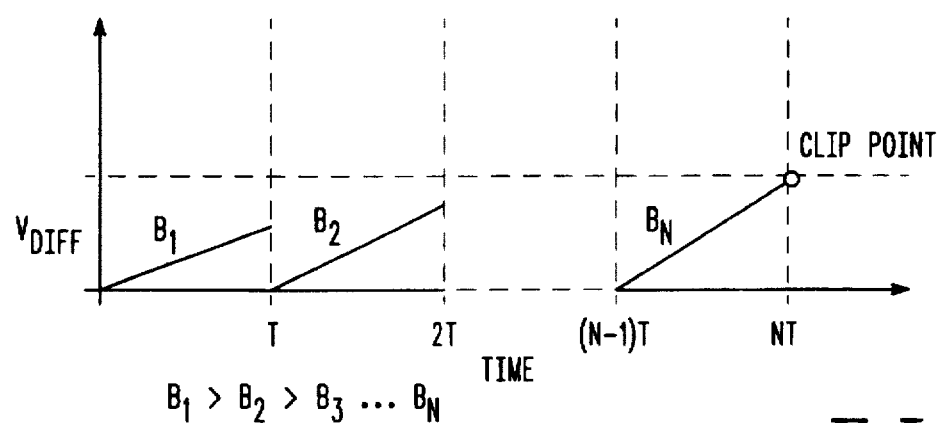
FIG. 4 shows multiple iteration sequences for the embodiments of FIGS. 1 or 2.

In a first embodiment of the present invention changing the feedback gain changes the slope or magnitude of the differential voltage signal 33. Thus, different amounts of feedback gain B produce different levels of differential voltage 33 for the same level of input voltage ($V_{in}$) 26 as shown in FIG. 3. An increase in the gain level B reduces the differential voltage 33 thereby reducing the slope of the line B shown in FIG. 3 making the curve B reach a clip point later in time. Thus, by changing the feedback gain B the clip point can be pushed to coincide with an end of an amplitude training sequence as shown in FIG. 4 thus causing no clipping or splatter. FIG. 4 shows resulting ramping signals for different values of feedback gain B plotted against differential voltage and time.

FIG. 4 shows that given enough time an amplitude training sequence may be repeated for different levels of feedback gain B. The training starts with a high level of feedback gain B which keeps the power amplifier in a linear region. In each of the following iterations or training sequences the feedback gain is reduced thus increasing the slope or magnitude of the training signal $V_{in}$ 26. By performing multiple iterations of training, the clip point may be approached carefully avoiding unnecessary splatter or adjacent channel interference.

FIG. 4 shows an adaptive multiple iteration approach according to a first embodiment of the present invention. Training is completed when the end of a ramping signal coincides with clip point.

The feedback gain B may be changed by an adaptive algorithm. Referring back to FIG. 1, the variable gain element 15 which is controlled by the host processor 16 may be adjusted accordingly. In training mode operation, it may be proposed that the driver 21 will have a maximum available gain, initially, resulting in a small differential voltage 33, hence the training signal of the power amplifier will initially ramp in a linear region, thus no clipping or splatter. The ramp generator will ramp up to its final value without clipping the power amplifier. As long as the differential voltage 33 does not reach the threshold voltage no data will be sampled. The gain of the driver element 21 will be reduced by 0.5 dB by appropriate control signal 42 to the variable gain element 15. The process continues until the amount of gain reduction makes the differential voltage 33 to be equal or greater than the threshold voltage. At which time clip point is detected and the host processor 40 resets the gain of the variable gain element 15 to its nominal value and sets the attenuator 80 to a required value so that a signal from the DSP 35 never exceeds the required value.

Alternatively, as shown in FIG. 2, varying the magnitude of the ramping signal may be attained by varying a level control of the input signal 26. Varying the level control of the input signal 26 effectively varies the magnitude of the ramping signal thereby allowing the clip point to be approached iteratively and minimising adjacent channel splatter.

In FIG. 2 a variable attenuator 32 is added at the output of the analog ramp generator. The operation is similar to that described above except that the only difference is that the process starts inserting a maximum available attenuation and reducing the amount of attenuation by steps of 0.5 dB until clip is detected. The introduction of such attenuator 44 enables the input to the summing element $V_i$ 26 to be varied during both amplitude training and normal operation.

There might be a need to repeat phase training with every new amplitude training period in order to prevent amplifier instability.

Figure 5:
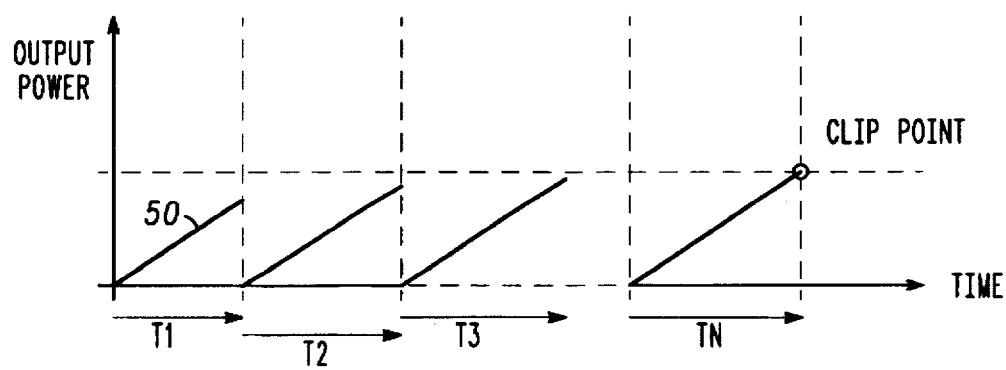
FIG. 5 shows multiple iteration sequences according to a third embodiment of the present invention.

In a second embodiment of the present invention, FIG. 5 shows multiple training sequences where an amplitude ramp training signal 50 is controlled iteratively by time duration of the sequence Thus, the magnitude of the input signal is changing based on the duration of the training signal but the slope of the training signal is not changed. The time duration of each multiple sequence is iteratively changed. Thus, the amplitude training signal is successively generated for longer periods of time duration until a clip point is reached at an end of one of the ramp up sequences When the clip point is reached the repetitive amplitude training signal process will be stopped and the training sequence and clip level will be recorded. The information may be used in future training periods to set new, optimal values for the initial training sequence (T1). The incremental training sequence may be either a linear progression or some form of companding approach where smaller changes to the incremental training sequence are used when the training sequence nears the anticipated clip detect time. Such an approach could give rise to a much improved performance for cases where there has been little change to the radio's characteristics since the last amplitude training routine.

Thus, the clip level and clip period of the training signal could be set independent of transmitter ageing. Other factors such as radio temperature and battery voltage could be included in the decision process for setting the duration of the initial training sequence and incremental training sequence.

Similarly, history or other factors may also be included in the first embodiment of the present invention when changing the magnitude of the training signal. Also either the first embodiment or the second embodiment of the present invention may be implemented separately or in any combination thereof to implement the present invention of multiple sequences of amplitude training for an amplitude training period.

Figure 6:
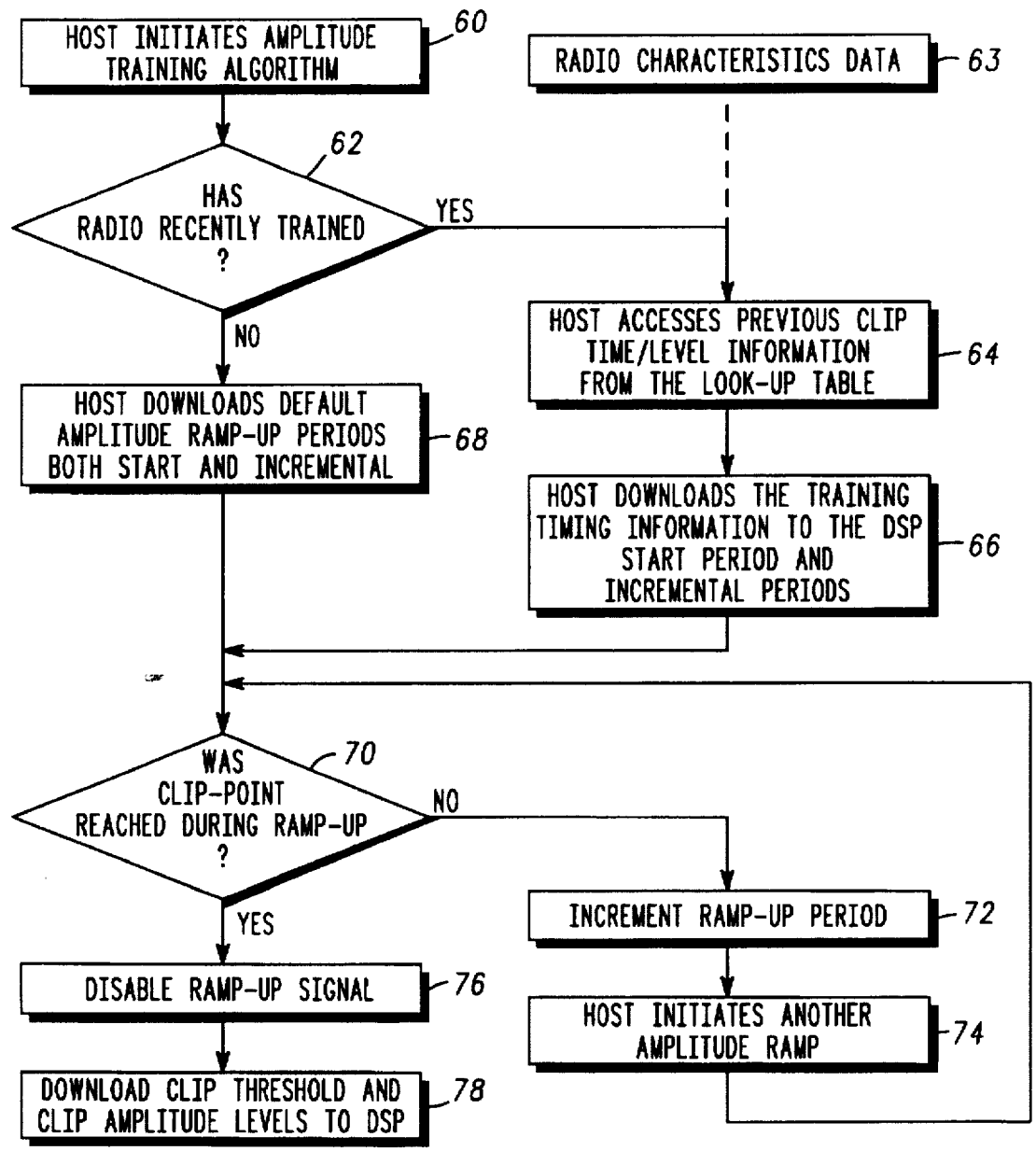
FIG. 6 is a flow chart according to the third embodiment of the present invention.

FIG. 6 shows a flowchart for an implementation of the method of FIG. 5. In step 60, the host processor initiates an amplitude training algorithm. The training algorithm may be initiated due to a new transmission request, a given, predetermined time has elapsed since the last amplitude training routine was initiated or the radio's characteristics (temperature, voltage, etc.) have changed beyond a given or relative threshold If the radio has recently been trained as determined by step 62, the host processor accesses previous training data and may access radio characteristic information from a look up table in RAM as in steps 63 and 64 and downloads such information to the DSP as in step 66.

If the radio has not been recently trained as determined in step 62, the host downloads default ramp up sequences for both start and incremental sequences as in step 68.

As the amplitude ramp up signal completes its allotted ramp up sequence, the radio determines whether the clip point has been detected using a clip error signal as in step 70. If not, the ramp up sequence is increased as according to the conditions detailed above, from the look up table, given either linear progressions or some for of companding method as in step 72 and the process is repeated as in step 74.

If clip point is detected in step 70 then the ramp up signal is disabled as in step 76 and any information is downloaded to the DSP to assist in the future determination of training sequences to be used as in step 78.

Figure 7:
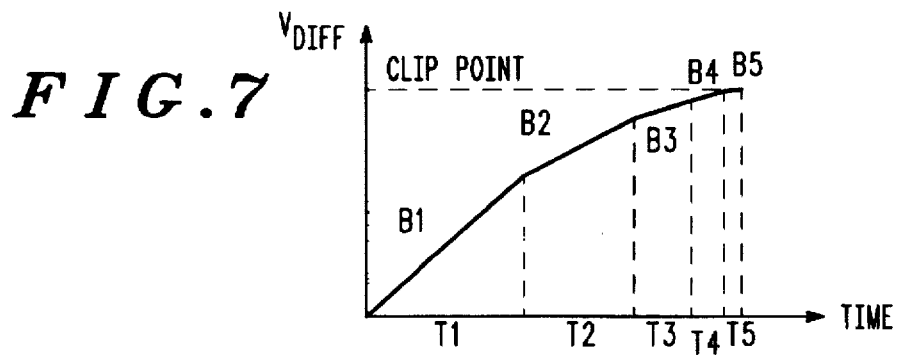
FIG. 7 is shows an adaptive sequence according to a fourth embodiment of the present invention.

FIG. 7 shows a single adaptive training sequence according to a fourth embodiment of the present invention. Using an adaptive approach in a single training sequence both the time duration and the slope of the input training signal may be changed as shown by different time segments T1-T5 and B1-B5 where T is time and B is slope. Thus, adaptively changing one or more parameters clip point may be approached without causing unnecessary adjacent channel interference in a single iteration of a training sequence.

The present invention of repetitive training sequences for one training period controls the undesired power splattering during training and allows clip point to be approached systematically and efficiently in an allotted amount of time. The method may be adjusted for any given allotted time. Thus, repetitive training allows implementation of an adaptive method minimising adjacent channel interference during amplitude training.

We claim:

1. A method for determining an optimum operating point in a linear power amplifier having a feedback circuit comprising the step of:

adaptively changing a parameter of an input training signal to the power amplifier in response to a signal output from the power amplifier in successive iterations of the training signal wherein the adapted parameter is a time duration of the input training signal.

2. A method for determining an optimum operating point in a linear power amplifier having a feedback circuit comprising the step of:

adaptively changing a parameter of an input training signal to the power amplifier in response to a signal output from the power amplifier in successive iterations of the training signal wherein the adapted parameter is a rate of change of signal level of the input training signal.

3. The method of claim 1 wherein the step of changing a parameter comprises adaptively changing the duration of the input training signal and a rate of change of a signal level of the input training signal in successive iterations.

4. The method of claim 1 wherein the time duration of the iterations is adaptively controlled to ensure that a clip point is reached at some time within a training period.

5. A method for determining an optimum operating point in a linear power amplifier having a feedback circuit comprising the step of:

adaptively changing an input training signal to the power amplifier in response to a signal output from the power amplifier, wherein the step of adaptively changing an input training signal comprises iteratively changing a parameter of the feedback circuit thereby performing multiple iterations of the feedback circuit during a training period, and wherein the parameter is a time duration of the iterations.

6. The method of claim 5 wherein the time duration of the iterations are adaptively controlled to ensure that a clip point is reached at some time within the training period.

7. The method of claim 2 further comprising the step of:

terminating operation of the training signal when a clip point is reached thereby minimizing any interference effects caused by the training signal.

8. The method of claim 1 further comprising the step of:

initiating a training operation in response to one of:
a new transmission request,
a given predetermined time having elapsed since a previous training operation was performed, and
operational characteristics of the power amplifier have exceeded a given threshold.

9. The method of claim 2 further comprising the step of:

initiating a training operation in response to one of:
a new transmission request,
a given predetermined time having elapsed since a previous training operation was performed, and
operational characteristics of the power amplifier have exceeded a given threshold.

10. The method of claim 1 further comprising the steps of:

determining history of previous training periods; and
selecting parameters of subsequent training periods based on the history of previous training periods.

11. A method of amplitude training to determine an optimum operating point of a linear amplifier linear power amplifier comprising the steps of:

inputting a training signal into the linear power amplifier;
adapting a parameter of the training signal in response to an output signal from the linear power amplifier in successive iterations of the training signal; and
determining an optimum operating point of the linear power amplifier in accordance with at least one parameter adaptation,
wherein the adapted parameter is one of a rate of change of input signal level, time duration, rate of change and time duration of the input training signal.

12. A linear power amplifier comprising:

a baseband circuit having a training signal generator for outputting a training signal;
a power amplifier operably coupled to the baseband circuit for amplifying a signal output from the baseband circuit;
a feedback circuit operably coupled to an output of the power amplifier for providing an amplified feedback signal to the feedback circuit; and
a processor operably coupled to the baseband circuit for adaptively changing one of duration, rate of change of input signal level, rate of change of input signal level and duration of the training signal in successive iterations of the training signal in response to the amplified feedback signal.

13. The linear power amplifier of claim 12 further comprising a dual mode feedback operation wherein different levels of feedback gain are used for normal and training modes of operation.

* * * * *